(12) United States Patent
Kim et al.

(10) Patent No.: US 10,748,942 B2
(45) Date of Patent: *Aug. 18, 2020

(54) DISPLAY DEVICE

(71) Applicant: SAMSUNG DISPLAY CO., LTD., Yongin-si, Gyeonggi-Do (KR)

(72) Inventors: Yang Wan Kim, Yongin-si (KR); Sun Ja Kwon, Yongin-si (KR); Byung Sun Kim, Yongin-si (KR); Hyun Ae Park, Yongin-si (KR); Su Jin Lee, Yongin-si (KR); Jae Yong Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/437,353

(22) Filed: Jun. 11, 2019

(65) Prior Publication Data

US 2019/0296052 A1 Sep. 26, 2019

Related U.S. Application Data

(63) Continuation of application No. 15/869,618, filed on Jan. 12, 2018, now Pat. No. 10,347,665, which is a continuation of application No. 15/344,690, filed on Nov. 7, 2016, now Pat. No. 9,893,093.

(30) Foreign Application Priority Data

Apr. 5, 2016 (KR) .................. 10-2016-0041331

(51) Int. Cl.
*H01L 27/12* (2006.01)
*H01L 27/32* (2006.01)

(52) U.S. Cl.
CPC ........ *H01L 27/124* (2013.01); *H01L 27/1218* (2013.01); *H01L 27/3276* (2013.01); *H01L 27/3279* (2013.01); *H01L 2251/5338* (2013.01)

(58) Field of Classification Search
CPC .................................................. H01L 27/124
See application file for complete search history.

(56) References Cited

U.S. PATENT DOCUMENTS

| | | |
|---|---|---|
| 2013/0342429 A1 | 12/2013 | Choi et al. |
| 2014/0042406 A1 | 2/2014 | Degner et al. |
| 2014/0198067 A1 | 7/2014 | Jeon |
| 2014/0254111 A1 | 9/2014 | Yamazaki et al. |
| 2015/0187279 A1 | 7/2015 | Lee et al. |
| 2017/0287936 A1 | 10/2017 | Kim et al. |
| 2018/0138207 A1 | 5/2018 | Kim et al. |

FOREIGN PATENT DOCUMENTS

| | | |
|---|---|---|
| KR | 10-2014-0092682 | 7/2014 |
| KR | 10-2015-0079206 | 7/2015 |

*Primary Examiner* — Karen Kusumakar
(74) *Attorney, Agent, or Firm* — F. Chau & Associates, LLC

(57) ABSTRACT

A display device includes a substrate including a pixel area and a peripheral area located outside the pixel area; pixels located in the pixel area; power supply lines configured to provide an operating power to the pixels; and a plurality of data fanout wires configured to provide data signals to the pixels, wherein, in at least a portion of the peripheral area, the power supply lines and the plurality of data fanout wires are arranged on a same layer.

17 Claims, 8 Drawing Sheets

DISPLAY DEVICE

CROSS-REFERENCE TO RELATED APPLICATIONS

This application is a continuation of U.S. patent application Ser. No. 15/869,618 filed Jan. 12, 2018, which is a continuation application of U.S. patent application Ser. No. 15/344,690 filed Nov. 7, 2016, now U.S. Pat. No. 9,893,093, which claims priority under 35 U.S.C. § 119 to Korean Patent Application No. 10-2016-0041331, filed on Apr. 5, 2016, in the Korean Intellectual Property Office, the disclosures of which are incorporated by reference herein in their entireties.

TECHNICAL FIELD

Exemplary embodiments of the present inventive concept relate to a display device.

DESCRIPTION OF THE RELATED ART

A display device is an output device for presentation of information in visual form. In general, a display device has a display part located on a substrate. By bending a portion of such a display device, the visibility of the display device from various angles may be increased and the area of a nondisplay area of the display device may be reduced.

However, a defect may occur in the process of fabricating a bent display device or the battery life of the bent display device may be reduced.

SUMMARY

According to an exemplary embodiment of the present inventive concept, there is provided a display device including a substrate comprising a pixel area and a peripheral area located outside the pixel area; pixels located in the pixel area; power supply lines configured to provide an operating power to the pixels; and a plurality of data fanout wires configured to provide data signals to the pixels, wherein, in at least a portion of the peripheral area, the power supply lines and the plurality of data fanout wires are arranged on a same layer.

The substrate may include a first plane area in which the pixel area is located; a first bending area located at one side of the first plane area; and a second plane area located at one side of the first bending area.

Furthermore, the power supply lines and the plurality of data fanout wires may be located on a same layer in the first bending area.

Furthermore, in the first bending area, the plurality of data fanout wires may include a first data fanout wire part, a second data fanout wire part spaced apart from the first data fanout wire part by a first distance, a third data fanout wire part spaced apart from the second data fanout wire part by a second distance, and a fourth data fanout wire part spaced apart from the third data fanout wire part by a third distance.

Furthermore, in the first bending area, at least one of the power supply lines may be located between the first data fanout wire part and the second data fanout wire part, between the second data fanout wire part and the third data fanout wire part, or between the third data fanout wire part and the fourth data fanout wire part.

Furthermore, the display device may include a pad portion arranged at one side of the second plane area, wherein the power supply lines are electrically connected to the pad portion.

Furthermore, the power supply lines may include a first power supply line and a second power supply line, the first power supply line may include a first connecting part configured to be connected to the pad portion, and the second power supply line is configured to be connected to the pad portion, and comprises a pair of second connecting parts located at both sides of the first connecting part.

Furthermore, in the first bending area, the first connecting part may be located between the second data fanout wire part and the third data fanout wire part.

In the first bending area, one second connecting part of the pair of second connecting parts may be located between the first data fanout wire part and the second data fanout wire part, and the other second connecting part of the pair of second connecting parts may be located between the third data fanout wire part and the fourth data fanout wire part.

Furthermore, the pair of second connecting parts may be configured to extend from the pad portion to one side of the first bending area contacting the first plane area in a straight line.

Furthermore, a layer in the first bending area where the plurality of data fanout wires are located and a layer in the first plane area where the plurality of data fanout wires are located may be different from each other.

Furthermore, a layer in the first bending area where the second connecting part is located and a layer in the first plane area where the second connecting part is located may be different from each other.

Furthermore, in the first plane area, a layer where the plurality of data fanout wires are located and a layer where the second connecting part is located may be different from each other.

Furthermore, a first voltage applied to the first power supply line may be greater than a second voltage applied to the second power supply line.

Furthermore, each of the pixels may include a light emitting diode and at least one thin film transistor, and the light emitting diode may include a first electrode electrically connected to the thin film transistor, and a second electrode facing the first electrode.

Furthermore, the first voltage may be applied to the first electrode, and the second voltage may be applied to the second electrode.

Furthermore, at least one of the plurality of data fanout wires may have a greater width in the first plane area than in the first bending area.

Furthermore, at least one of the plurality of data fanout wires may have a greater width in the second plane area than in the first bending area.

Furthermore, the width of at least one of the plurality of data fanout wires in the first plane area increases as a distance from the pad portion to the pixel area increases.

Furthermore, the width of at least one of the plurality of data fanout wires in the second plane area increases as a distance from the pad portion to the pixel area increases.

According to an exemplary embodiment of the present inventive concept there is provided a display device including: a substrate comprising a first plane area, a second plane area and a bent area disposed between the first and second plane areas; a plurality of data fanout wires disposed in first plane area, the second plane area and the bent area; and a plurality of power wires disposed in first plane area, the second plane area and the bent area, wherein the power wires and the data fanout wires are included in a same layer in the bent area and the power wires and the data fanout wires are included in different layers in the first or second plane areas.

According to an exemplary embodiment of the present inventive concept there is provided a display device including: a substrate comprising a first plane area, a second plane area and a bent area disposed between the first and second plane areas; a plurality of data fanout wire areas disposed in the bent area; and a power wire disposed between at least two pairs of the data fanout wire areas in the bent area, wherein the data fanout wires areas and the power wire are disposed in a same layer in the bent area.

BRIEF DESCRIPTION OF THE DRAWINGS

The above and other features of the present inventive concept will become more apparent by describing in detail exemplary embodiments thereof with reference to the accompanying drawings in which.

DETAILED DESCRIPTION OF THE EMBODIMENTS

Figure 1:
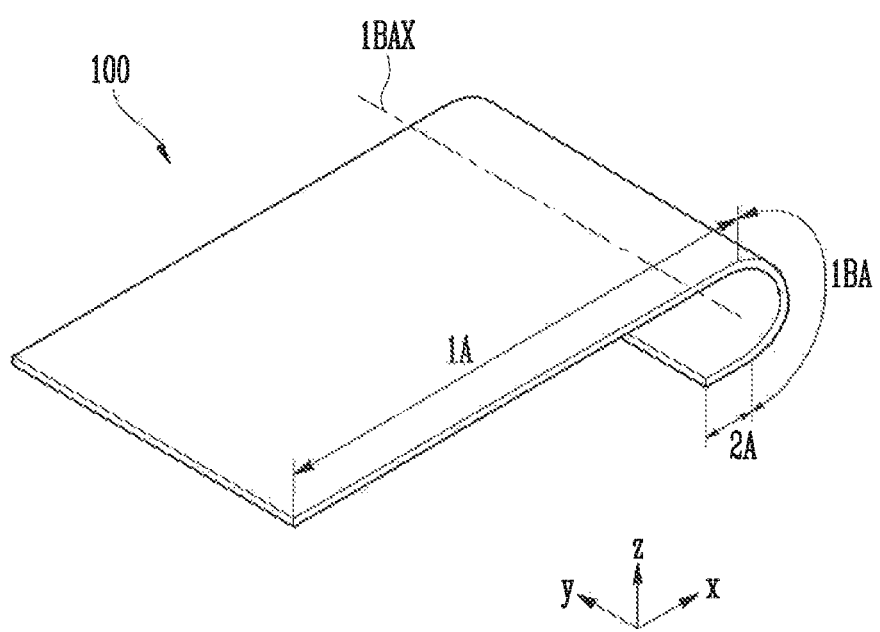
FIG. 1 is a perspective view schematically illustrating a portion of a display device according to an exemplary embodiment of the present inventive concept.

Hereinafter, exemplary embodiments of the present inventive concept will be explained in detail with reference to the drawings attached. This inventive concept may, however, be embodied in many different forms and should not be construed as being limited to the embodiments set forth herein. Like reference numerals refer to like elements throughout the drawings and specification, and thus repeated explanations may be omitted.

When an element such as layer, a film, and a plate, etc. is referred to as being "on" another element, it may be directly on the other element, or it may be indirectly on the other element through one or more intervening elements. In the drawings, the thickness or size of elements may be exaggerated for clarity.

In the following embodiments, the x axis, the y axis and the z axis are not limited to three axes on an orthogonal coordinate system, but may be construed as having a broader meaning. For example, the x axis, the y axis and the z axis may lie at right angles to one another, but they may also represent other directions that do not lie at right angles to one another.

Figure 2:
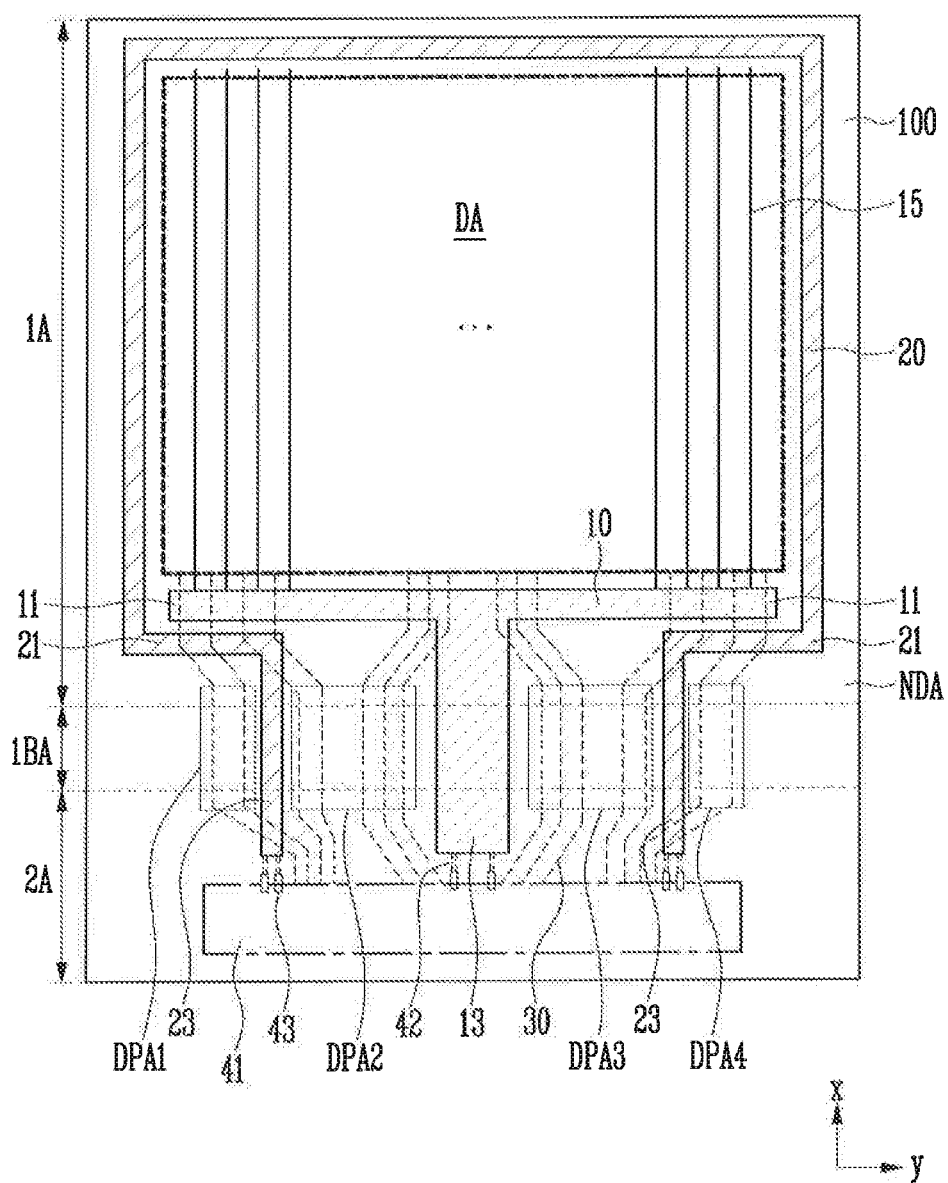
FIG. 2 is a plane view of a substrate illustrated in FIG. 1 according to an exemplary embodiment of the present inventive concept.
Figure 3:
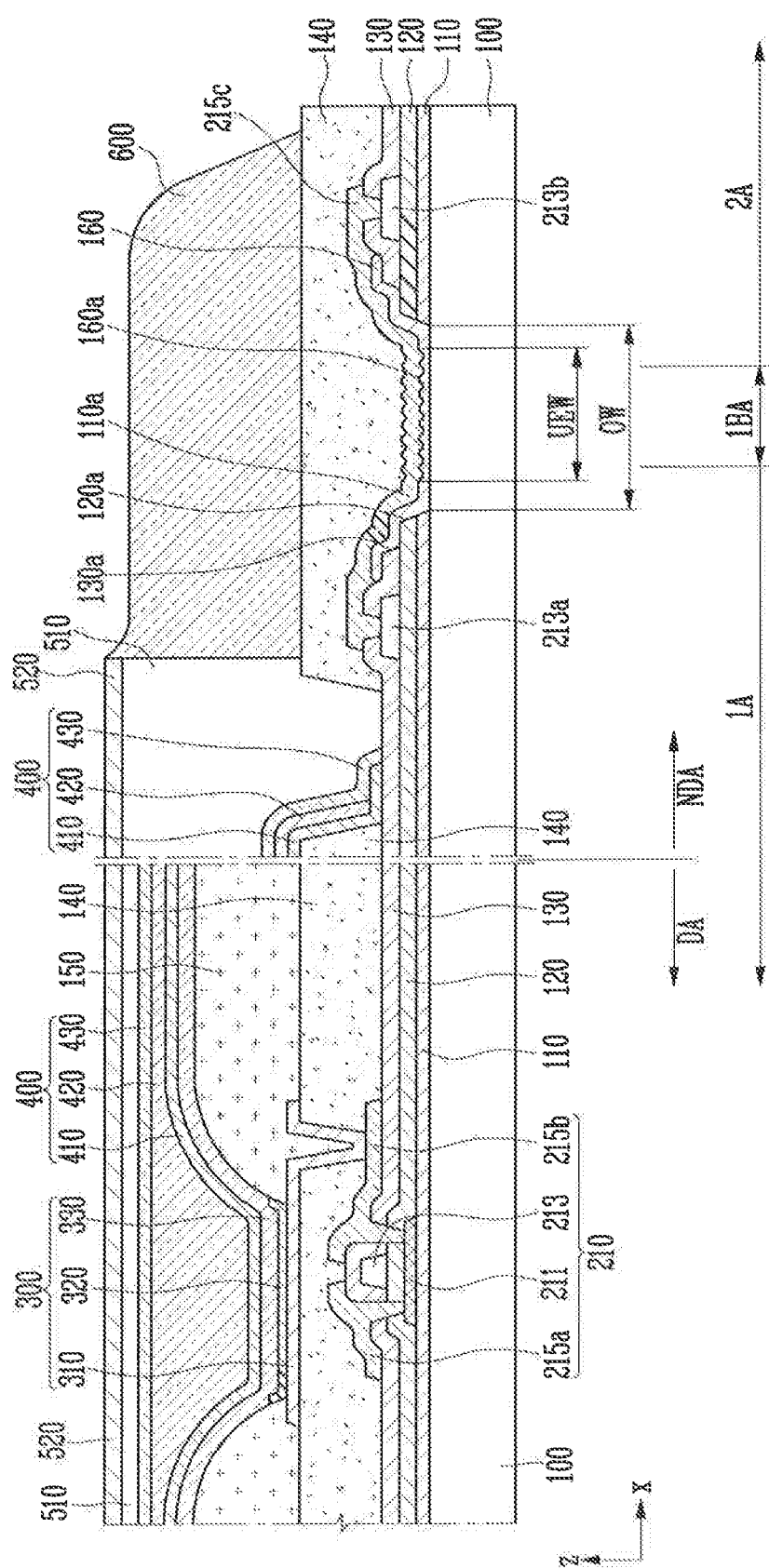
FIG. 3 is an x-z plane view of the display device illustrated in FIG. 1 according to an exemplary embodiment of the present inventive concept.

FIG. 1 is a perspective view schematically illustrating a portion of a display device according to an exemplary embodiment of the present inventive concept, FIG. 2 is a plane view of a substrate illustrated in FIG. 1 according to an exemplary embodiment of the present inventive concept, and FIG. 3 is an x-z plane view of the display device illustrated in FIG. 1 according to an exemplary embodiment of the present inventive concept.

For convenience of explanation, FIGS. 2 and 3 illustrate a substrate that is in an unbent state, even though it actually is.

Hereinafter, a display device according to an exemplary embodiment of the present inventive concept will be explained in detail with reference to FIGS. 1 to 3.

As illustrated in FIG. 1, a portion of a substrate 100 that constitutes the display device may have a bent shape, and according to the shape of the bent substrate 100, the display device may also have a bent shape.

Referring to FIG. 1, the substrate 100 may include a first plane area 1A, a first bending area 1BA and a second plane area 2A.

The first bending area 1BA is configured to extend in a first direction (y direction), and may be located between the first plane area 1A and the second plane area 2A with respect to the second direction (x direction) that intersects with the first direction.

The first bending area 1BA may be a portion of the substrate 100 that is bent along on a first bending axis 1BAX extending in the first direction as illustrated in FIG. 1.

The substrate 100 may include various materials having a flexible or bendable characteristic, for example, polymer resin such as polyethersulphone (PES), polyacrylate (PAR), polyetherimide (PEI), polyethylene napthalate (PEN), polyethylene terepthalate (PET), polyphenylene sulfide (PPS), polyarylate, polyimide (PI), polycarbonate (PC) and cellulose acetate propionate (CAP).

The first plane area 1A of the substrate 100 may include a pixel area DA that displays an image recognizable by a user, and a peripheral area NDA on outskirts of the pixel area DA. The first bending area 1BA and the second plane area 2A may not be provided within the pixel area DA, but rather in the peripheral area NDA.

The pixel area DA and the peripheral area NDA may include at least one light emitting diode, data lines (or data fanout wires) for providing a data signal to each pixel of the pixel area DA, scan lines for providing a scan signal, light emitting lines for providing a light emitting signal, a power supply line and a pad portion for providing a power voltage, etc.

Examples of the light emitting diode include a liquid crystal display, an organic light emitting diode and the like. However, the present inventive concept is not limited thereto. However, for convenience of explanation, explanations will be made where the light emitting diode included in the pixel area is an organic light emitting diode.

As illustrated in FIG. 3, within the pixel area DA of the substrate 100, on a planarization layer 140, there may be located an organic light emitting diode 300 having a pixel electrode 310, an opposed electrode 330 and a middle layer 320 that is interposed between the pixel electrode 310 and the opposed electrode 330 and that includes a light emitting layer.

As illustrated in FIG. 3, the pixel electrode 310 contacts one of a source electrode 215a and a drain electrode 215b through an opening formed on the planarization layer 140 and the like, and thus is electrically connected to a thin film transistor 210.

On an upper portion of the planarization layer 140, a pixel defining film 150 may be arranged. This pixel defining film 150 has an opening corresponding to each pixel, in other words, an opening that allows at least a central portion of the pixel electrode 310 to be exposed, thereby defining the pixel.

Further, in such cases as illustrated in FIG. 3, the pixel defining film 150 may increase the distance between an edge of the pixel electrode 310 and the opposed electrode 330 on an upper portion of the pixel electrode 310, thereby preventing an arc from occurring at the edge of the pixel electrode 310. The pixel defining film 150 may be made of an organic material such as, for example, polyimide and hexamethyldisiloxane (HMDSO), etc.

The middle layer 320 of the organic light emitting diode 300 may include a low molecular material or a high molecular material. In the case where the middle layer 320 of the organic light emitting diode 300 includes a low molecular material, it may have a structure where a hole injection layer (HIL), a hole transport layer (HTL), an emission layer (EML), an electron transport layer (ETL), and an electron injection layer (EIL), etc. are stacked in a singular or complex structure, and may include various organic materials including copper phthalocyanine, (CuPc), N,N-di(naphthalene-1-yl)-N,N'-diphenyl-benzidine (N,N'-Di(naphthalene-1-yl)-N,N'-diphenyl-benzidine: NPB), tris-8-hydroxyquinoline aluminum (tris-8-hydroxyquinoline aluminum) (Alq3), etc. These layers may be formed in a vacuum deposition method.

In the case where the middle layer 320 includes a high molecular material, it may have a structure including the HTL and the EML. Here, the HTL may include a PEDOT, and the emission layer may include a high molecular material such as a poly-phenylenevinylene (PPV) and polyfluorene material. This middle layer 320 may be made by a screen printing method, an inkjet printing method, or a laser induced thermal image (LITI) and the like.

The middle layer 320 is not limited thereto, and thus may have various structures. Further, the middle layer 320 may include a layer integrated across the plurality of pixel electrodes 310, or a layer patterned to correspond to each of the plurality of pixel electrodes 310.

The opposed electrode 330 is arranged on an upper portion of the pixel area DA, for example, to cover the pixel area DA as illustrated in FIG. 3. In other words, the opposed electrode 330 may be integrated across the plurality of organic light emitting diodes, and correspond to the plurality of pixel electrodes 310.

The organic light emitting diode 300 may be damaged by moisture or oxygen and the like from outside, and thus an encapsulation layer 400 may be used to cover and thereby protect the organic light emitting diode 300.

The encapsulation layer 400 may extend up to an exterior side of the pixel area DA while covering the pixel area DA. The encapsulation layer 400 may include a first inorganic encapsulation layer 410, an organic encapsulation layer 420, and a second inorganic encapsulation layer 430.

The first inorganic encapsulation layer 410 may cover the opposed electrode 330, and may include silicone oxide, silicone nitride and/or silicon oxynitride, etc. Other layers such as a capping layer and the like may be located between the first inorganic encapsulation layer 410 and the opposed electrode 330.

The first inorganic encapsulation layer 410 is formed according to the structure of its lower portion, and thus as illustrated in FIG. 3, its upper surface may not be planarized. The organic encapsulation layer 420 may cover the first inorganic encapsulation layer 410, and may thus have a planarized upper surface.

For example, the organic encapsulation layer 420 may have the planarized upper surface corresponding to the pixel area DA. The organic encapsulation layer 420 may include one or more materials selected from the group consisting of polyethyleneterephthalate, polyethylenenapthalate, polycarbonate, polyimide, polyethylenesulfonate, polyoxymethylene, polyarylate, hexamethyldisiloxane and the like. The second inorganic encapsulation layer 430 may cover the organic encapsulation layer 420, and may include silicone oxide, silicone nitride, silicone oxynitride and the like. The second inorganic encapsulation layer 430 may contact the first inorganic encapsulation layer 410 at its edge located at an exterior of the pixel area DA, thereby preventing the organic encapsulation layer 420 from being exposed towards outside.

As mentioned above, the encapsulation layer 400 includes the first inorganic encapsulation layer 410, the organic encapsulation layer 420 and the second inorganic encapsulation layer 430. Since the encapsulation layer 400 has a multiple-layered structure, if a crack occurs within the encapsulation layer 400 it is possible to prevent a crack from being connected between the first inorganic encapsulation layer 410 and the organic encapsulation layer 420 or between the organic encapsulation layer 420 and the second inorganic encapsulation layer 430.

By keeping a crack from spreading, this may prevent or minimize a path from being formed, the path being one through which moisture or oxygen and the like from the outside may penetrate into the pixel area DA.

On the encapsulation layer 400, a polarizing plate 520 may be disposed near an optically clear adhesive 510 (OCA). The polarizing plate 520 may reduce outdoor daylight reflection.

For example, in the case where the outdoor daylight passes through the polarizing plate 520, and is reflected by the upper surface of the opposed electrode 330 and then passes through the polarizing plate 520 again, the phase of the outdoor daylight may change as it passes through the polarizing plate 520 twice.

As a result, by setting the phase of the reflected light to be different from the phase of the outdoor daylight that enters into the polarizing plate 520, and consequently reducing the outdoor daylight, it is possible to increase its observability.

The transparent adhesive 510 and the polarizing plate 520 may cover the opening of the planarization layer 140 as illustrated in FIG. 3. However, the display device according to the present inventive concept does not always have the polarizing plate 520, in other words, the polarizing plate 520 may be omitted or substituted for other elements. For example, the polarizing plate 520 may be omitted, and the outdoor daylight reflection may be reduced using a black matrix and a color filter instead.

In addition, a buffer layer 110, a gate insulating film 120, and an interlayer insulating film 130 including an inorganic material may be referred to as a first inorganic insulating layer. The first inorganic insulating layer may have a first opening corresponding to the first bending area 1BA as illustrated in FIG. 3.

In other words, the buffer layer 110, the gate insulating film 120 and the interlayer insulating film 130 may respectively have openings 110a, 120a, 130a corresponding to the first bending area 1BA. Such an opening may be referred to as the first opening overlapping the first bending area 1BA.

Here, the surface area of the first opening may be greater than the surface area of the first bending area 1BA. For example, in FIG. 3, it is illustrated that a width OW of the first opening is greater than a width of the first bending area 1BA. In addition, the width of a portion UWE including the uneven surface 160a is narrower than the width of the first opening.

Here, the surface area of the first opening may be defined as the surface area of the opening with the smallest surface area from among the openings 110a, 120a, 130a of the buffer layer 110, the gate insulating film 120, and the interlayer insulating film 130. For example, in FIG. 3, it is illustrated that the surface area of the first opening is defined by the surface area of the opening 110a of the buffer layer 110.

For reference, FIG. 3 illustrates that an inner surface of the opening 110a of the buffer layer 110 and an inner surface of the opening 120a of the gate insulating film 120 correspond to each other, but the present inventive concept is not limited thereto.

For example, the surface area of the opening 110a of the buffer layer 110 may be greater than the surface area of the opening 120a of the gate insulating film 120. In this case, the surface area of the first opening may be defined as the surface area of the opening with the smallest surface area from among the openings 110a, 120a, 130a of the buffer layer 110, the gate insulating film 120 and the interlayer insulating film 130.

The display device according to the present embodiment is provided with an organic matter layer 160 that fills at least one portion of the first opening of the first inorganic insulating layer. FIG. 3 illustrates that the organic matter layer 160 fills an entirety of the first opening.

Further, the display device according to the present embodiment is provided with a first conductive layer 215c which extends from the first plane area 1A via the first bending area 1BA to the second plane area 2A, and is located on the organic matter layer 160.

Where there is no organic matter layer 160, the first conductive layer 215c may be located on an inorganic insulating layer such as the interlayer insulating film 130 and the like. The first conductive layer 215c may be made of a same material as the source electrode 215a and the drain electrode 215b.

In addition, on the first conductive layer 215c located in the first plane area 1A and the second plane area 2A, an insulating film may be further provided, and the insulating film may be made of an inorganic material such as silicone oxide($SiO_2$), silicone nitride(SiNx), silicon oxynitride (SiON), aluminum oxide($Al_2O_3$), titanium oxide($TiO_2$), tantalum oxide($Ta_2O_5$), hafnium oxide($HfO_2$), zinc oxide ($ZrO_2$), etc. Further, the insulating film may not be included in the first bending area 1BA.

The first conductive layer 215c may correspond to a fanout wire or a power supply line to be explained hereinafter.

As mentioned above, although FIG. 3 illustrates that the display device is in an unbent state, it is to be understood that, in the display device according to the present embodiment, the substrate 100 and the like are in a bent state in the first bending area 1BA.

To achieve this bent state, in the fabricating process of the display device, the substrate may be fabricated as a substrate in a planarized state as illustrated in FIG. 2 or FIG. 3, and thereafter, the substrate 100 and the like may be bent such that the first bending area 1BA is bent to enable the display device to have the shape as illustrated in FIG. 1.

Here, when the first bending area 1BA of the substrate 100 is being bent, a tensile stress may be applied to the first conductive layer 215c, but in the case of the display device according to the present embodiment, it is possible to prevent defects from occurring in the first conductive layer 215c during such a bending process.

For example, if the first inorganic insulating layer such as the buffer layer 110, the gate insulating film 120 and/or the interlayer insulating film 130 do not have an opening in the first bending area 1BA, and thus has a continuous shape from the first plane area 1A via the first bending area 1BA to the second plane area 2A, and the first conductive layer 215c is located on the first inorganic insulating layer, a large tensile stress will be applied to the first conductive layer 215c when the substrate 100 is bent.

For example, since the hardness of the first inorganic insulating layer is higher than that of the organic matter layer 160, there is a high possibility that a crack and the like may occur on the first inorganic insulating layer of the first bending area 1BA. In addition, if a crack occurs on the first inorganic insulating layer, the crack may also occur on the first conductive layer 215c of the first inorganic insulating layer as well, thereby increasing the possibility that defects such as a short circuit of the first conductive layer 215c may occur.

In the case of the display device according to the present embodiment, as mentioned above, the first inorganic insulating layer has the first opening in the first bending area 1BA, and the portion of the first bending area 1BA of the first conductive layer 215c is located on the organic matter layer 160 that fills at least a portion of the first opening of the first inorganic insulating layer.

In other words, since the first inorganic insulating layer has the first opening in the first bending area 1BA, there is an very low possibility that a crack and the like may occur on the first inorganic insulating layer, and in the case of the organic matter layer 160, the possibility that a crack may occur is also low due to the characteristics of the organic matter. Therefore, it is possible to prevent cracks and the like from occurring in the first bending area 1BA portion of the first conductive layer 215c located on the organic matter layer 160, or at least minimize the possibility of a crack.

The organic matter layer 160 has a lower hardness than the inorganic matter layer, and thus it is possible to effectively minimize the tensile stress from being concentrated on the first conductive layer 215c since the organic matter layer 160 absorbs the tensile stress that occurs by the bending of the substrate 100.

The display device according to the present embodiment may be provided with a second conductive layer 213a, 213b in addition to the first conductive layer 215c.

The second conductive layer 213a, 213b may be arranged on the first plane area 1A or on the second plane area 2A such that it is located on a different layer from where the first conductive layer 215c is located, and may be electrically connected to the first conductive layer 215c.

In FIG. 3, it is illustrated that the second conductive layer 213a, 213b is made of a same material as a gate electrode 213 of the thin film transistor 210 and is located on a same layer as the gate electrode 213, in other words, on the gate insulating film 120. The thin film transistor 210 further includes a semiconductor layer 211.

Further, it is illustrated that the first conductive layer 215c contacts the second conductive layer 213a, 213b through a contact hole formed in the interlayer insulating film 130. Further, it is illustrated that the second conductive layer 213a is located on the first plane area 1A and the second conductive layer 213b is located on the second plane area 2A.

The second conductive layer 213a located on the first plane area 1A may be one that is electrically connected to the thin film transistor 210 and the like within the pixel area DA. For example, the second conductive layer 213a may be electrically connected to the thin film transistor 210 and the like within the pixel area DA via the second conductive layer 213a.

The second conductive layer 213b located on the second plane area 2A may also be electrically connected to the thin film transistor 210 and the like within the pixel area DA by the first conductive layer 215c.

As mentioned above, the second conductive layer 213a, 213b may be located on an exterior of the pixel area DA while at the same time being electrically connected to the elements located within the pixel area DA. In addition, the second conductive layer 213a, 213b may be located on an exterior of the pixel area DA and at the same time extend in the pixel area DA direction such that at least a portion thereof is located within the pixel area DA.

As mentioned above, although FIG. 3 illustrates that the display device is in an unbent state, in the display device according to the present embodiment, the first bending area 1BA of the substrate is in fact in a bent state as illustrated in FIG. 1.

To achieve the bent state, in the fabricating process of the display device, the substrate may be fabricated as a substrate in a planarized state as illustrated in FIG. 3, and thereafter, the substrate 100 and the like may be bent such that the first bending area 1BA is bent to enable the display device to have the shape as illustrated in FIG. 1.

Here, during the bending process of the first bending area 1BA, a tensile stress may be applied to the elements located within the first bending area 1BA.

Therefore, by forming the first conductive layer 215c crossing the first bending area 1BA with a material with a high elongation ratio, it is possible to prevent a crack from occurring on the first conductive layer 215c or prevent defects such as a short circuit and the like from occurring in the first conductive layer 215c.

Therefore, on the first plane area 1A or on the second plane area 2A and the like, the second conductive layer 213a, 213b may be formed with a material having a lower elongation ratio than the first conductive layer 215c. In addition, the second conductive layer 213a, 213b may have different electrical/physical characteristics than the first conductive layer 215c.

Accordingly, it is possible to increase the efficiency of electrical signal transfer or decrease the occurrence of defects in the fabricating process of the display device of the present embodiment.

For example, the second conductive layer 213a, 213b may include molybdenum, and the first conductive layer 215c may include aluminum. The first conductive layer 215c or the second conductive layer 213a, 213b may have a multi-layered-structure.

Further, in the case of the second conductive layer 213b located on the second plane area 2A, at least a portion of the upper portion of the second conductive layer 213b may be exposed towards the outside instead of covering it with the planarization layer 140 so that it may be electrically connected to various electronic devices or printed circuit boards and the like.

In addition, as illustrated in FIG. 3, it is possible to have the organic matter layer 160 cover the inner surface of the first opening of the first inorganic insulating layer.

As mentioned above, the first conductive layer 215c may be made of a same material as the source electrode 215a and the drain electrode 215b, and in this case, a conductive layer may be formed on a front surface of the substrate 100 and then patterned to form the source electrode 215a, the drain electrode 215b, and the first conductive layer 215c.

If the organic matter layer 160 does not cover the inner surface of the opening 110a of the buffer layer 110, the inner surface of the opening 120a of the gate insulating film 120, or the inner surface of the opening 130a of the interlayer insulating film 130, in the process of patterning the first conductive layer 215c, the conductive material may remain on a certain portion without being removed from the inner surface of the opening 110a of the buffer layer 110, the inner surface of the opening 120a of the gate insulating film 120, or the inner surface of the opening 130a of the interlayer insulating film 130. In this case, the remaining conductive material may cause a short between other conductive layers.

Therefore, the organic matter layer 160 is formed to cover the inner surface of the first opening of the first inorganic insulating layer.

In addition, although FIG. 3 illustrates that the organic matter layer 160 has a uniform thickness, the thickness may vary depending on its location so that curves of the upper surface of the organic matter layer 160 have slight slopes near the inner surface of the opening 110a of the buffer layer 110, the inner surface of the opening 120a of the gate insulating layer 120, and the inner surface of the opening 130a of the interlayer insulating film 130.

Accordingly, in the process of patterning the conductive layer to form the source electrode 215a, the drain electrode 215b and the first conductive layer 215c, it is possible to effectively prevent the conductive material from remaining in portions from which they might need to be removed.

In addition, as illustrated in FIG. 3, the organic matter layer 160 may have an uneven surface 160a on at least one portion of the upper surface (in +z direction). As the organic matter layer 160 has the uneven surface 160a, the first conductive layer 215c located on the organic matter layer 160 may have an upper surface and/or a lower surface corresponding to the uneven surface 160a of the organic matter layer 160.

As mentioned above, since the tensile stress may be applied to the first conductive layer 215c as the first bending area 1BA is bent in the fabricating process, by enabling the upper surface and/or the lower surface of the first conductive layer 215c to have a shape corresponding to the uneven surface 160a of the organic matter layer 160, it is possible to minimize the amount of tensile stress applied to the first conductive layer 215c.

In other words, it is possible to reduce the tensile stress that may occur in the bending process by transforming the shape of the organic matter layer 160 having a lower hardness. Further, by enabling the shape of the first conductive layer 215c having the uneven shape to be transformed to correspond to the shape of the organic matter layer 160 that changes due to the bending, it is possible to effectively prevent defects such as a short circuit and the like from occurring on the first conductive layer 215c.

Furthermore, by enabling the uneven surface 160a to be formed on at least one portion of the upper surface of the organic matter layer 160 in +z direction, it is possible to increase the surface area of the upper surface of the organic matter layer 160 and the surface area of the upper/lower surface of the first conductive layer 215c in the first opening.

Regarding the upper surface of the organic matter layer 160 and the upper/lower surface of the first conductive layer 215c, because the size of this surface area is greater there is more leeway to transform its shape and thus reduce the tensile stress caused by the bending of the substrate 100 and the like.

Figure 4:
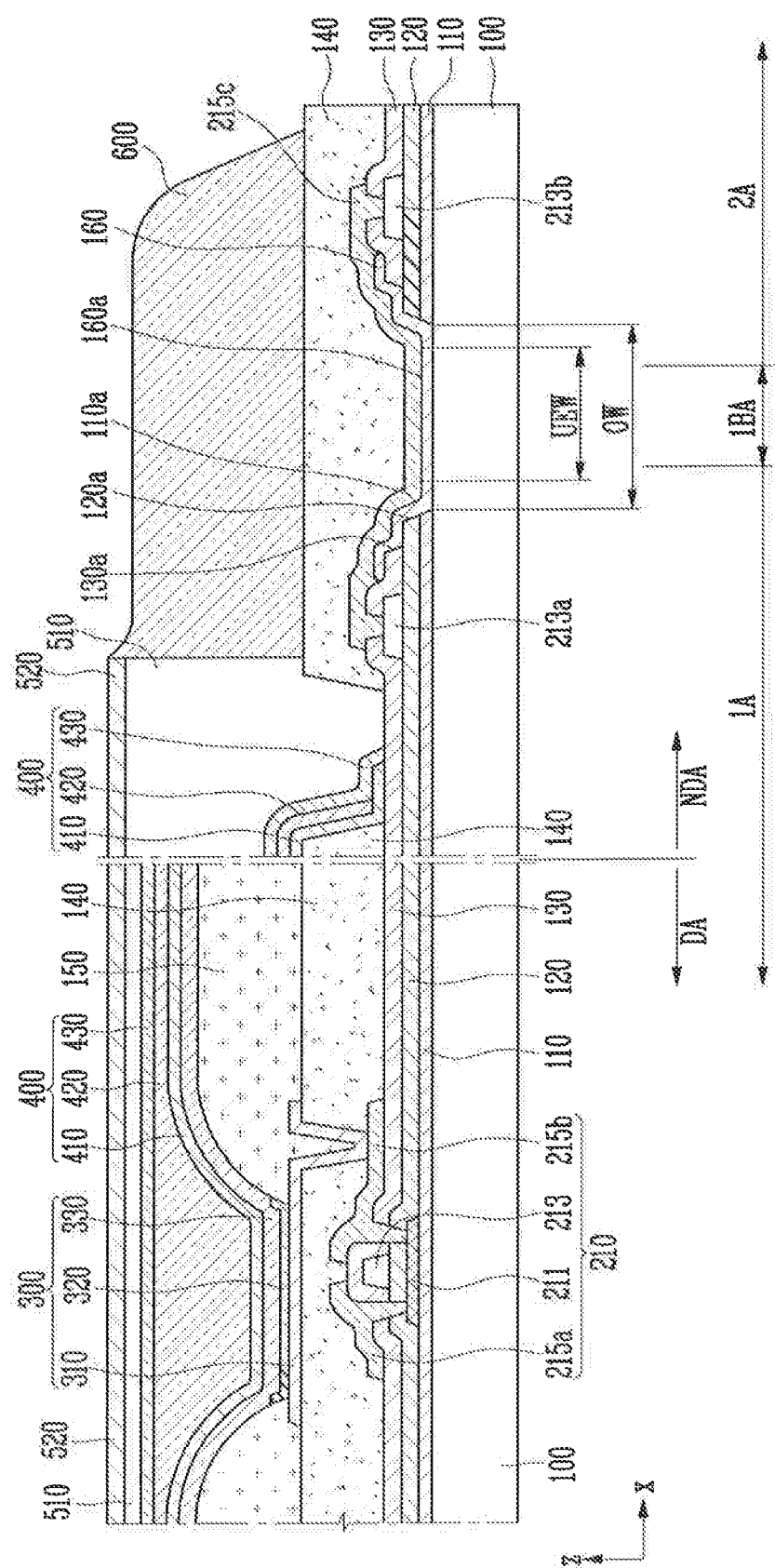
FIG. 4 is an x-z plane view of a substrate according to an exemplary embodiment of the present inventive concept.

FIG. 4 is a x-z plane view of the substrate according to an exemplary embodiment of the present inventive concept.

In FIG. 3, it is illustrated that the uneven surface 160a is formed on at least a portion of the organic matter layer 160, however, the present inventive concept is not limited thereto. In other words, as illustrated in FIG. 4, the organic matter layer 160 may be formed as a planarized layer without an uneven surface in the first bending area 1BA.

Since the substrate illustrated in FIG. 4 has a similar configuration as the substrate illustrated in FIG. 3 except for the fact that there is no uneven surface formed on the organic matter layer 160, repetitive descriptions will be omitted.

Furthermore, although FIG. 3 illustrates that the buffer layer 110 is removed from the first bending area 1BA, the inventive concept is not limited thereto, and thus the first bending area 1BA may include the buffer layer 110.

In addition, at an exterior side of the pixel area DA, a stress neutralization layer 600, e.g., a Bending Protection Layer (BPL) may be arranged. In other words, the stress neutralization layer 600 may be located on the first conductive layer 215c in at least the first bending area 1BA.

When bending a stacked body, a stress neutral plane will exist inside the stacked body. When there is no such stress neutralization layer 600, excessive tensile stress and the like may be applied to the first conductive layer 215c within the first bending area 1BA according to the bending of the substrate 100 and the like.

This is because the location of the first conductive layer 215c may not correspond to the stress neutralization plane. However, by enabling the existence of the stress neutralization layer 600 and then adjusting its thickness and modulus and the like, it is possible to adjust the location of the neutral plane in the stacked body including the substrate 100, the first conductive layer 215c, the stress neutralization layer 600 and the like.

Therefore, by disposing the stress neutralization plane near the first conductive layer 215c by the stress neutralization layer 600, it is possible to minimize the tensile stress applied to the first conductive layer 215c.

The stress neutralization layer 600 may extend to the end of an edge of the substrate 100 of the display device.

For example, regarding the second plane area 2A, at least a portion of the first conductive layer 215c, the second conductive layer 213b and/or other conductive layers electrically connected therefrom may be electrically connected to various electronic devices or to printed circuit boards and the like instead of being covered by the interlayer insulating film 130 or the planarization layer 140 and the like.

Accordingly, there may exist a portion of the first conductive layer 215c, the second conductive layer 213b and/or other conductive layers electrically connected therefrom that are electrically connected to various electronic devices or printed circuit boards and the like.

Here, the portion to be electrically connected may be protected from impurities such as moisture from outside, and thus by enabling the stress neutralization layer 600 to cover such an electrically connected portion, the stress neutralization layer 600 also functions a protection layer. In this case, the stress neutralization layer 600 may extend to the end of the edge of the substrate 100 of the display device.

As illustrated in FIG. 2, the first plane area 1A includes the pixel area DA. In the pixel area DA, a plurality of pixels are located, and accordingly, the pixel area DA may display an image. Therefore, the pixel area may be referred to as the display area.

In the first plane area 1A, the peripheral area NDA is further included. In the peripheral area NDA, elements (for example, driving portion and wire, etc.) for driving the pixels may be arranged.

Since there are no pixels in the peripheral area NDA, it may be referred to as a non-display area. The peripheral area NDA may exist on an exterior side of the pixel area DA, and may have a shape surrounding at least a portion of the pixel area DA.

The first bending area 1BA is arranged on an exterior at one side of the first plane area 1A, and elements (for example, wires etc.) for driving the pixels of the first plane area 1A may be located in the first bending area 1BA.

There are no pixels in the first bending area 1BA, and the elements disclosed in the first bending area 1BA may be connected to the elements located in the peripheral area NDA of the first plane area 1A.

The second plane area 2A is arranged on an exterior at one side of the first bending area 1BA, and elements (for example, wires and band portion etc.) for driving the pixels of the first plane area 1A may be located in the second plane area 2A.

There are no pixels in the second plane area 2A, but the peripheral area NDA may include pixels.

Hereinafter, explanation will be made about the first plane area 1A, power supply lines 10, 13, 20, 23 arranged in the peripheral area NDA of the first bending area 1BA and the second plane area 2A, data fanout wire 30, and pad portion PAD.

The power supply line 10, 13, 20, 23 may supply power to the pixels of the pixel area DA, for example, to the organic light emitting diode (OLED).

The power supply line 10, 13, 20, 23 may be formed using a same material as the source electrode 215a and the drain electrode 215b. For example, the power supply line 10, 13, 20, 23 may be made of one or more of aluminum (Al), platinum (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

As illustrated in FIG. 2, the power supply line 10, 13, 20, 23 may include a first power supply line 10, a first connecting part 13 connecting the first power supply line 10 with the pad portion PAD, a second power supply line 20, and a second connecting part 23 connecting the second power supply line 20 with the pad portion PAD.

The first power supply line 10 may be arranged to correspond to one side of the pixel area DA, and for example, to correspond to one side of the pixel area DA adjacent to the pad portion PAD.

The first power supply line 10 may be configured to extend along the first direction illustrated in FIG. 2, and may include one pair of first ends 11 configured to be parallel to one side of the pixel area DA.

As illustrated in FIG. 2, the power supply line 10, 13, 20, 23 may further include a plurality of first subordinate lines 15 that extend from the first power supply line 10 and that are arranged on the pixel area DA to supply power to the OLED.

In FIG. 2, only a portion of the first subordinate lines 15 are illustrated, and although a plurality of first subordinate lines 15 are illustrated in a form extending in the second direction, this is merely exemplary, for example, the first subordinate lines 15 may be in a variety of ways. In other words, the plurality of first subordinate lines 15 may consist of a plurality of lines extending in the first direction and a plurality of lines extending in the second direction to form a mesh structure.

The second power supply line 20 may be arranged to surround the rest of the sides of the pixel area DA. For example, the second power supply line 20 may surround three sides of the pixel area DA and part of the side where the first power supply line 10 is arranged.

The second power supply line 20 may include one pair of second ends 21 that are bent to surround the one pair of first ends 11, and each of the one pair of first ends 11 may be located between the pixel area DA and the one pair of second ends 21.

The first voltage that is applied to the first power supply line 10 may be greater than the second voltage that is applied to the second power supply line 20.

In other words, the first power supply line 10 may be an operating voltage (ELVDD) line, and the second power supply line 20 may be a common voltage (ELVSS) line.

The first voltage applied to the first power supply line 10 that is the operating voltage (ELVDD) line may be applied to the first electrode of the OLED through the first power supply line 10 and the first subordinate lines 15.

The second voltage applied to the second power supply line 20 that is the common voltage (ELVSS) line may be applied to the second electrode of the OLED through the second power supply line 20.

The first power supply line 10 may include the first connecting part 13, and the second power supply line 20 may include the second connecting part 23, and the first connecting part 13 and the second connecting part 23 may be connected to the pad portion PAD arranged in the second plane area 2A.

The first connecting part 13 may be configured to extend from the first power supply line 10 along the second direction, and may be connected to the pad portion PAD via a portion of the first bending area 1BA and the second plane area 2A. Although FIG. 2 illustrates that there is one first connecting part 13, the number of the first connecting parts 13 is not limited thereto.

Furthermore, although FIG. 2 illustrates that the first connecting part 13 is connected to the central area of the pad portion PAD, the present inventive concept is not limited thereto, and thus the first connecting part 13 may be have portions extending from both ends 11 thereof to connect to both ends of the pad portion PAD.

For example, referring to FIG. 2, since the plurality of data fanout wires 30 to be explained hereinafter include a first data fanout wire area DPA1, a second data fanout wire area DPA2 spaced apart from the first data fanout wire area (DPA1) by a certain distance, a third data fanout wire area DPA3 spaced apart from the second data fanout wire area DPA2 by a certain distance, and a fourth data fanout wire area DPA4 spaced apart from the third data fanout wire area DPA3 by a certain distance, in the first bending area 1BA, the first connecting part 13 may be located in a space provided between the second data fanout wire area DPA2 and the third data fanout wire area DPA3.

The second connecting part 23 may be arranged at both sides of the first connecting part 13.

The second connecting part 23 may include one pair of second connecting parts 23 that extend from the second power supply line 20 in a parallel direction to the first connecting part 13.

For example, the one pair of second connecting parts 23 may each extend from the one pair of second ends 21 bent to surround the one pair of first ends 11. The one pair of second connecting parts 23 may be connected to the pad portion PAD via a portion of the first bending area 1BA and the second plane area 2A. For example, the one pair of second connecting parts 23 may each be located in a space between the first data fanout wire area DPA1 and the second data fanout wire area DPA2, and in a space between the third data fanout wire area DPA3 and the fourth data fanout wire area DPA4.

Here, the locations of the space between the first data fanout wire area DPA1 and the second data fanout wire area DPA2 and the space between the third data fanout wire area DPA3 and the fourth data fanout wire area DPA4 may vary depending on the location of a pad 43 connected to the second connecting part 23 so that the second connecting part 23 may be configured to extend from the pad 43 of the pad portion PAD in a direction parallel to the second direction. In other words, the space between adjacent fanout wire areas may correspond to the location of the pad 43 connected to the second connecting part 23.

Furthermore, as illustrated in FIG. 2, the one pair of second connecting parts 23 may each be arranged to be closer to the first connecting part 13 than to the one pair of first ends 11.

In other words, the one pair of second ends 21 that are bent may extend further in the first direction than is shown in FIG. 2 so that the second connecting parts 23 are closer to the portion of the first connecting part 13 extended to the pad portion PAD. It is to be understood however that the location of the second connecting parts 23 is not limited thereto.

In FIG. 2, there may be further provided a third power supply line for transferring an initialization voltage that initiates the driving thin film transistor from among the thin film transistors. In other words, the third power supply line may be an initialization voltage line Vint.

The third power supply line may be arranged on the left and right sides of the pixel area DA of the first plane area 1A, and may be connected to the pad portion PAD via a portion of the peripheral area NDA of the first plane area 1A, the first bending area 1BA and the second plane area 2A.

Further, the display device according to the present embodiment may further include a VGH wire and a VGL wire for adjusting the voltage level in the peripheral area NDA.

For example, the VGH wire and the VGL wire may be arranged to surround the sides of the pixel area DA except for a portion of the side where the first power supply line 10 is arranged.

The display device according to the present embodiment may further include the data fanout wire 30 arranged in the peripheral area NDA.

The data fanout wire 30 is connected to the pads of the pad portion PAD, and may apply the data voltage to a data wire arranged in the pixel area DA.

FIG. 2 is a plane view of the display device, and thus, the data fanout wire 30 is illustrated together with the power supply lines 10, 13, 20, 23, however the data fanout wire 30 may be arranged on a different layer from that of the first power supply line 10, the second power supply line 20, the first connecting part 13 and the second connecting part 23, and may be electrically separated therefrom by an insulating layer.

Figure 5:
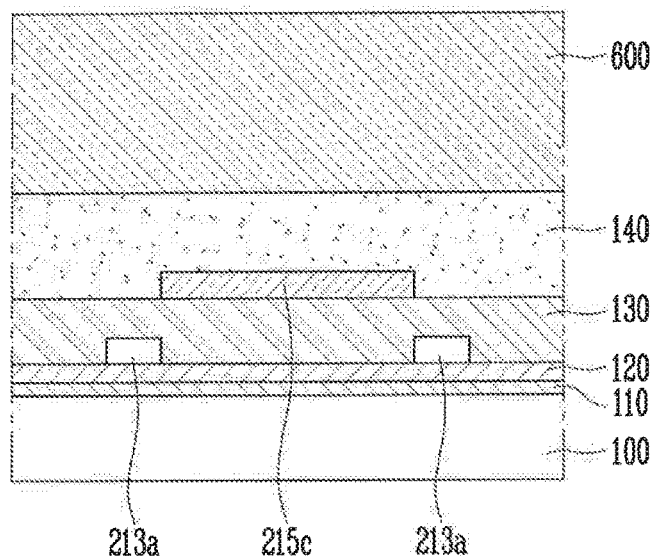
FIG. 5 is a view of a portion of a y-z plane of a first plane area of the substrate illustrated in FIG. 1 according to an exemplary embodiment of the present inventive concept.

FIG. 5 is a view illustrating a portion of a y-z plane of the first plane area 1A of the substrate 100 illustrated in FIG. 1 according to an exemplary embodiment of the present inventive concept. Referring to FIG. 5, on the y-z plane of the first plane area 1A, the second conductive layer 213a formed on a same layer as the gate electrode 213 of the thin film transistor 210 corresponds to the data fanout wire 30, and the first conductive layer 215c made of a same material as the source electrode 215 or the drain electrode 215b may correspond to the power supply line 10, 13, 20, 23. In other words, as illustrated in FIG. 5, the data fanout wire 30 and the power supply line 10, 13, 20, 23 may be arranged on different layers from each other while having the interlayer insulating film 130 therebetween.

As mentioned above, the power supply line, in other words, the first power supply line 10, the second power supply line 20, the first connecting part 13 and the second connecting part 23 may be formed on the same layer as the source electrode 215a and the drain electrode 215b using the same material as the source electrode 215a and the drain electrode 215b.

In addition, in some areas (for example, in the first plane area 1A), the data fanout wire 30 may be insulated from the first power supply line 10, the second power supply line 20, the first connecting part 13 and the second connecting part 23 by the interlayer insulating film 130, and may be formed on the same layer as the gate electrode 213 using the same material as the gate electrode 213.

Furthermore, in some areas, the data fanout wire 30 may be formed on the same layer using the same material as the first connecting part 13 and the second connecting part 23.

Hereinafter, the pad portion PAD included in the second plane area 2A will be explained in detail.

The pad portion PAD may include a driver IC 41, the pad 43 connecting the driver IC 41 and the pixel circuit (e.g., the display area DA), and a power fanout wire 42.

The driver IC 41 may include a data driving part for supplying a data signal, and further, various functional parts used for driving the pixel circuit.

The driver IC 41 is a chip on glass (COG) type driver integrated circuit (IC) 41 that may be mounted onto the substrate 100. At one side of the driver IC 41, an access terminal for electrically accessing the pad 43 may be included. The pad 43 and the access terminal may be bonded to each other by interposing an adhesive material capable of carrying a current and including a conductive ball. Examples of such an adhesive material include, for example, an anisotropic conductive film, a self organizing conductive film and the like.

The driver IC 41 is electrically connected to the pad 43 via the access terminal. For example, left and right sides of the driver IC 41 may be connected to the second connecting parts 23. The middle part of the pad 43 may be electrically connected with the power fanout wire 42. The pad 43 may be formed on a layer different from the power fanout wire 42, but the present inventive concept is not limited thereto, and thus the pad 43 may be arranged on the same layer as the power fanout wire 42.

The pad 43 may be formed in a single-layered or multi-layered structure with a material including at least one selected from molybdenum (Mo), aluminum (Al), copper (Cu), silver (Ag), titanium (Ti) and the like.

The data fanout wire 30 may also be electrically connected to the plurality of pads 43. For example, an additional pad 43 may be provided near the pads connected to the power fanout wire 42 so that the data fanout wire 30 can be electrically connected thereto.

The power fanout wire 42 and the data fanout wire 30 may be formed on the same layer, and the pad connected to the data fanout wire 30 may be formed on the same layer as the data fanout wire 30 or on another layer.

The power fanout wire 42 may connect the pad 43 and the pixel circuit. The power fanout wire 42 may be formed on the same layer as the gate electrode 213. In other words, the power fanout wire 42 may be arranged on an upper portion of the gate insulating film 120.

Figure 6:
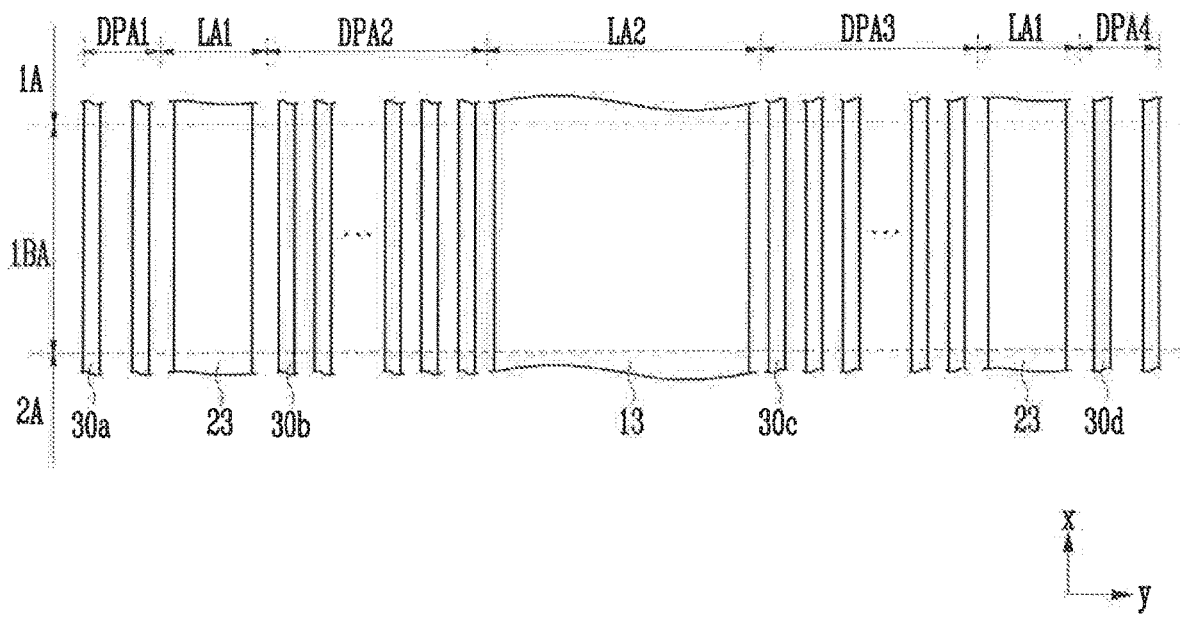
FIG. 6 is an enlarged view of a portion of the plane view illustrated in FIG. 2 according to an exemplary embodiment of the present inventive concept.

FIG. 6 is an enlarged view of a portion of the plane view illustrated in FIG. 2 according to an exemplary embodiment of the present inventive concept. For example, it is an enlarged view of the data fanout wire 30, the first connecting part 13, and the second connecting part 23 located in the first bending area 1BA.

As illustrated in FIG. 6, the data fanout wire 30 may be configured to include first data fanout wires 30a located in the first data fanout wire area DPA1, second data fanout wires 30b located in the second data fanout wire area DPA2, third data fanout wires 30c located in the third data fanout wire area DPA3, and fourth data fanout wires 30d located in the fourth data fanout wire area DPA4.

The first data fanout wire area DPA1 and the second data fanout wire area DPA2 may be spaced apart from each other by a certain distance. In other words, in the first bending area 1BA, a data fanout wire may not be provided between the first data fanout wire area DPA1 and the second data fanout wire area DPA2.

The second data fanout wire area DPA2 and the third data fanout wire area DPA3 may be spaced apart from each other by a certain distance. In other words, in the first bending area 1BA, a data fanout wire may not be provided between the second data fanout wire area DPA2 and the third data fanout wire area DPA3.

The third data fanout wire area DPA3 and the fourth data fanout wire area DPA4 may be spaced apart from each other by a certain distance. In other words, in the first bending area 1BA, a data fanout wire may not be provided between the third data fanout wire area DPA3 and the fourth data fanout wire area DPA4.

In the present embodiment, the area between the first data fanout wire area DPA1 and the second data fanout wire area DPA2 may be called the first power wire area LA1, and the second connecting part 23 of the second power supply line 20 may be located in the first power wire area LA1.

Further, the area between the third data fanout wire area DPA3 and the fourth data fanout wire area DPA4 may also be called the first power wire area LA1, and the second connecting part 23 of the second power supply line 20 may be located in the first power wire area LA1.

The area between the second data fanout wire area DPA2 and the third data fanout wire area DPA3 may be called the second power wire area LA2, and the first connecting part 13 of the first power supply line 10 may be located in the second power wire area LA2.

In the first bending area 1BA, the first to fourth data fanout wires 30a, 30b, 30c, 30d, the first connecting part 13 of the first power supply line 10 and the second connecting part 23 of the second power supply line 20 may all be located on a same layer.

The layer on which the first to fourth data fanout wires 30a, 30b, 30c, 30d, the first connecting part 13 of the first power supply line 10, and the second connecting part 23 of the second power supply line 20 are located in the first bending area 1BA and the layer on which the first to fourth data fanout wires 30a, 30b, 30c, 30d, the first connecting part 13 of the first power supply line 10, and the second connecting part 23 of the second power supply line 20 are located in the peripheral area NDA of the first plane area 1A may be different from each other.

For example, the first to fourth data fanout wires 30a, 30b, 30c, 30d, the first connecting part 13 of the first power supply line 10 and the second connecting part 23 of the second power supply line 20 may be formed after the first bending area 1BA, the buffer layer 110, and the gate insulating film 120 are removed.

In other words, the first to fourth data fanout wires 30a, 30b, 30c, 30d, the first connecting part 13 of the first power supply line 10, and the second connecting part 23 of the second power supply line 20 may be formed like the first conductive layer 215c of FIG. 3.

In the present embodiment, the first bending area 1BA is an area to be bent at a later time, and to prevent cracks that occur as the substrate 100 is bent, and defects such as a short circuit due to the cracks, the wires located in the first bending area 1BA are formed on a same layer.

According to an exemplary embodiment of the present inventive concept, by forming the second connecting part 23 of the second power supply line 20 to pass between the data fanout wires 30a-d, the length of the wires forming the second power supply line 20 may be shortened, thereby minimizing the resistance.

The illustration of FIG. 6 is based on an assumption that two data fanout wires 30a are located in the first data fanout area DPA1, however, the present inventive concept is not thereto, and as the location of the pad 43 connected with the second connecting part 23, the total number of the data fanout wires 30 and the like are changed, the number of the data fanout wires 30a located in the first data fanout area DPA1 may vary.

The number of the data fanout wires 30b, 30c, 30d arranged in the second to fourth data fanout areas DPA2, DPA3, DPA4 may be changed as well.

Each of the data fanout wires 30a, 30b, 30c, 30d of the first bending area 1BA may be electrically connected to the data fanout wires 30a, 30b, 30c, 30d, and may be connected to the data fanout wire 30 located on a layer different from the layer where the data fanout wires 30a, 30b 30c 30d of the first bending area 1BA are located.

The data fanout wire 30 of the first plane area 1A may correspond to the second conductive layer 213a of FIG. 3, and as can be gleaned from FIG. 3, the data fanout wires 30a, 30b, 30c, 30d of the first bending area 1BA may contact the data fanout wire 30 of the first plane area 1A through a contact hole formed in the interlayer insulating film 130.

The data fanout wires 30a, 30b, 30c, 30d of the first bending area 1BA may be electrically connected to the thin film transistor and the like within the pixel area DA by the data fanout wire 30 of the first plane area 1A.

The second connecting part 23 of the first bending area 1BA may be electrically connected to the second connecting part 23 of the first plane area 1A, and may be connected to the second connecting part 23 located on a layer different from the layer where the second connecting part 23 of the first bending area 1BA is located.

The second connecting part 23 of the first plane area 1A may correspond to the second conductive layer 213a of FIG. 3, and as can be gleaned from FIG. 3, the second connecting part 23 of the first bending area 1BA may contact the second connecting part 23 of the first plane area 1A through the contact hole formed in the interlayer insulating film 130.

The second connecting part 23 of the first bending area 1BA may be electrically connected to the thin film transistor within the pixel area DA by the second connecting part 23 of the first plane area 1A.

The first connecting part 13 of the first bending area 1BA may be electrically connected to the first connecting part 13 of the first bending area 1BA, and may be connected to the first connecting part 13 provided on a layer different from the layer where the first connecting part 13 of the first bending area 1BA is located in the first plane area 1A.

The first connecting part 13 of the first plane area 1A may correspond to the second conductive layer 213a of FIG. 3, and as can be gleaned from FIG. 3, the first connecting part 13 of the first bending area 1BA may contact the first connecting part 13 of the first plane area 1A through the contact hole formed in the interlayer insulating film 130.

The first connecting part 13 of the first bending area 1BA may be electrically connected to the thin film transistor and the like within the pixel area DA by the first connecting part 13 of the first plane area 1A.

As mentioned above, the data fanout wire 30, the first connecting part 13 and the second connecting part 23 may each be located on different layers from one another in the first plane area 1A.

Each of the data fanout wires 30a. 30b, 30c, 30d of the first bending area 1BA may be electrically connected to the data fanout wires 30a, 30b, 30c, 30d, and may be connected to the data fanout wire 30 provided on a layer different from the layer where the data fanout wires 30a, 30b, 30c, 30d of the first bending area 1BA are located in the second plane area 2A.

The data fanout wire 30 of the second plane area 2A may correspond to the second conductive layer 213b of FIG. 3, and as can be gleaned from FIG. 3, the data fanout wires 30a, 30b, 30c 30d of the first bending area 1BA may contact the data fanout wire 30 of the second plane area 2A through the contact hole formed in the interlayer insulating film 130.

The data fanout wires 30a, 30b, 30c, 30d of the first bending area 1BA may be electrically connected to the pad portion PAD by the data fanout wire 30 of the second plane area 2A.

The second connecting part 23 of the first bending area 1BA may be electrically connected to the second connecting part 23 of the second plane area 2A, and may be connected to the second connecting part 23 provided on a layer different from the layer where the second connecting part 23 of the first bending area 1BA is located.

The second connecting part 23 of the second plane area 2A may correspond to the second conductive layer 213b of FIG. 3, and as can be gleaned from FIG. 3, the second connecting part 23 of the first bending area 1BA may contact the second connecting part 23 of the second plane area 2A through the contact hole formed in the interlayer insulating film 130.

The second connecting part 23 of the first bending area 1BA may be electrically connected to the pad portion PAD by the second connecting part 23 of the second plane area 2A.

The first connecting part 13 of the first bending area 1BA may be electrically connected to the first connecting part 13 of the second plane area 2A, and may be connected to the first connecting part 13 provided on a layer different from the layer where the first connecting part 13 of the first bending area 1BA is located.

The first connecting part 13 of the second plane area 2A may correspond to the second conductive layer 213b of FIG. 3, and as can be gleaned from FIG. 3, the first connecting part 13 of the first bending area 1BA may contact the first connecting part 13 of the second plane area 2A through the contact hole formed in the interlayer insulating film 130.

The first connecting part 13 of the first bending area 1BA may be electrically connected to the pad portion PAD and the like by the first connecting part 13 of the second plane area 2A.

As mentioned above, the data fanout wire 30, the first connecting part 13 and the second connecting part 23 in the second plane area 2A may be located on different layers from one another.

In other words, the data fanout wire 30, the first connecting part 13 and the second connecting part 23 may be located on a same layer only in the first bending area 1BA, but on different layers in the first and second plane areas 1A, 2A.

In addition, as illustrated in FIG. 6, the data fanout wire and the power wire (first power supply line 10, the first connecting part 13, the second power supply line 20 and the second connecting part 23) may be configured to have shapes that are symmetrical around the first connecting part 13.

In addition, illustrations in FIGS. 1 to 6 are based on an assumption that the data fanout wire 30 is divided into four areas, but the inventive concept is not limited thereto, and thus the number of the data fanout wire areas forming the data fanout wire 30 may vary.

Illustrations in FIGS. 1 to 6 are based on an assumption that in the first bending area 1BA, each of the data fanout wires 30 extends in a certain direction with a consistent width (in other words, a rectangular shape filled with a conductive material), but the inventive concept is not thereto.

In other words, the shape of each data fanout wire 30 may vary so that the stress due to a tensile strength resulting from the bending of the first bending area 1BA may be reduced. The shape of the data fanout wire 30 may vary to be for example: a mesh shape, a chain shape, a net shape, etc. consisting of lines of a conductive material. In addition, the first connecting part 13 or the second connecting part 23 may be configured to extend in a certain direction with a consistent width (in other words, a rectangular shape filled with a conductive material).

Figure 7A:
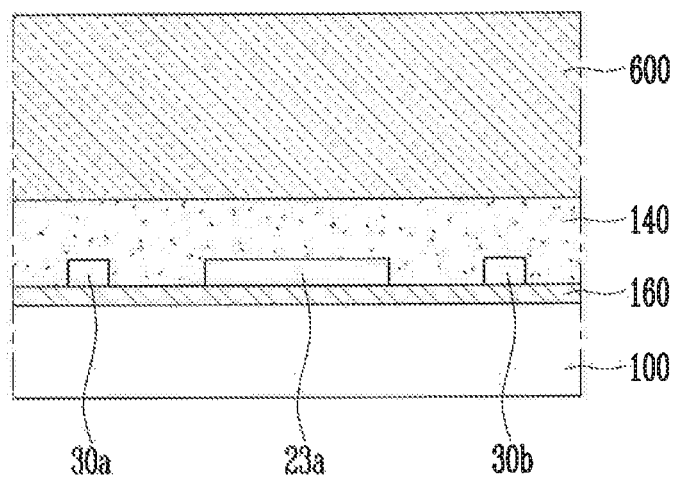
FIG. 7A is a view of a portion of a y-z plane of a first bending area of a substrate according to an exemplary embodiment of the present inventive concept.
Figure 7B:
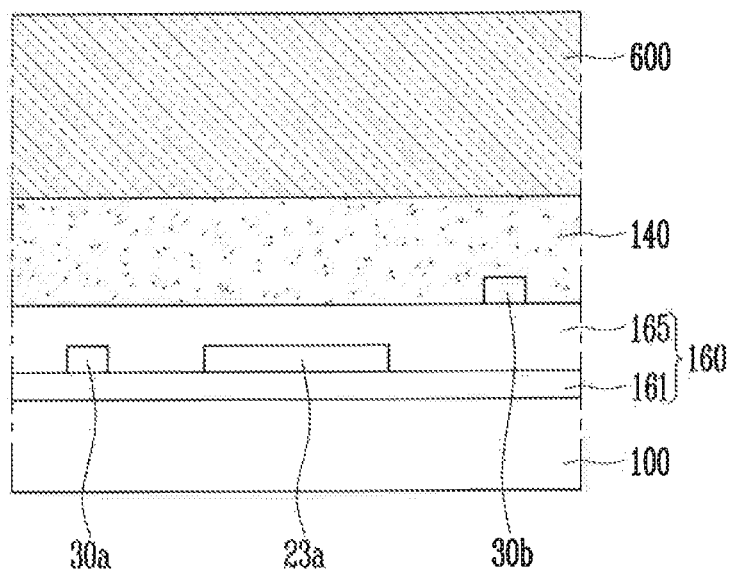
FIGS. 7B and 7C are views of a portion of a y-z plane of a first bending area of a substrate according to an exemplary embodiment of the present inventive concept.
Figure 7C:
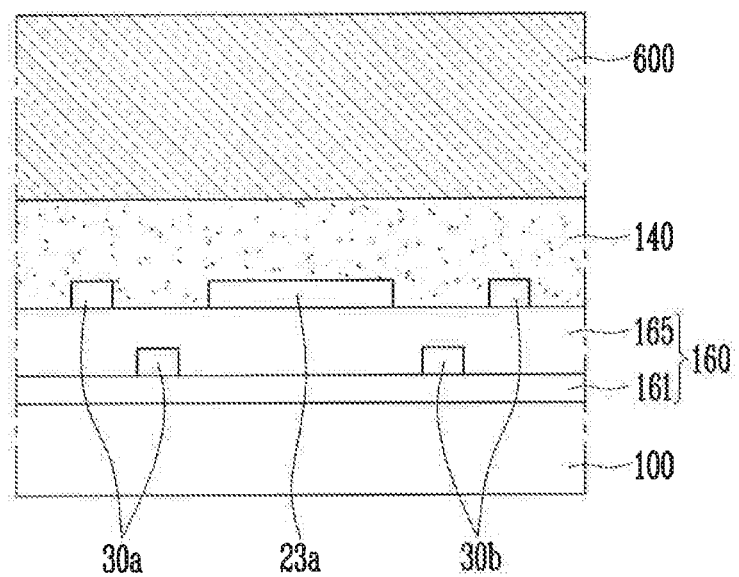

FIG. 7A is a view of a portion of a plane y-z in the first bending area 1BA of the substrate 100 according to an exemplary embodiment of the present inventive concept, and FIG. 7B and FIG. 7C are views of a portion of the plane y-z of the first bending area 1BA of the substrate 100 according to an exemplary embodiment of the present inventive concept.

Referring to FIG. 7A, the second connecting part 23a may be located on the organic matter layer 160, the data fanout wire 30a located in the first data fanout wire area may be on the left side of the second connecting part 23a on the organic matter layer 160, and the data fanout wire 30b located in the second data fanout wire area may be on the right side of the second connecting part 23a on the organic matter layer 160. In other words, as mentioned above, in the first bending area 1BA, all the data fanout wires 30 and the second connecting part 23 may be located on a same layer.

Referring to FIGS. 7B and 7C, an insulating layer (for example, the organic matter layer 160) may include the first insulating layer 161 and the second insulating layer 165, and some of the data fanout wires 30a-d may be located on the first insulating layer 161, while the rest of the data fanout wires 30a-d are located on the second insulating layer 165. In other words, the data fanout wire 30 may be formed as a dual-layer having the second insulating layer 165 therebetween.

Here, the second connecting part 23a may be provided on the first insulating layer 161 or on the second insulating layer 165 and on a same layer as at least one of the data fanout wires 30a-d.

Therefore, the second connecting part 23a and the data fanout wires 30a-d may be provided in various forms. By way of example, as illustrated in FIG. 7B, one of the data fanout wires 30a, 30b located on either side of the second connecting part 23a may be located on a same layer as the second connecting part 23a, and the other one may be located on another layer.

As illustrated in FIG. 7C, half of the data fanout wires 30a, 30b located on both sides of the second connecting part 23a may be located on a layer different from the second connecting part 23a, and half of the data fanout wires 30a, 30b may be located on a same layer as the second connecting part 23a.

In other words, in the case where the data fanout wire 30 is formed as a dual layer wire, the second connecting part 23a may be located on a same layer as at least some of the data fanout wires 30a-d.

Hereinafter, the shape of the data fanout wire 30 according to an exemplary embodiment of the present inventive concept will be explained with reference to FIG. 8.

Figure 8:
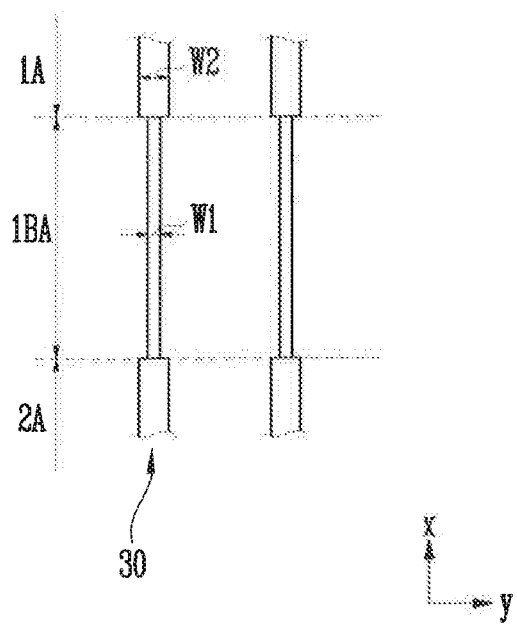
FIG. 8 is an enlarged plane view illustrating a portion of a data fanout wire according to an exemplary embodiment of the present inventive concept.

FIG. 8 is an enlarged plane view of a portion of the data fanout wire 30 according to an exemplary embodiment of the present inventive concept.

As illustrated in FIG. 2, the farther away the data fanout wire 30 is from the first connecting part 13, the longer the length of the data fanout wire 30. Therefore, the farther away the data fanout wire 30 is from the first connecting part 13, the greater the resistance of the data fanout wire 30.

In this case, by adjusting the width of the data fanout wire 30, it is possible to reduce the resistance between the data fanout wires 30.

However, since in the first bending area 1BA, the data fanout wires 30a, 30b, 30c, 30d are all formed on a same layer, the first connecting part 13 and the second connecting part 23 may limit the area where the data fanout wires 30a, 30b, 30c, 30d may be located. Therefore, there are limitations to increasing the width of each of the data fanout wires 30a, 30b, 30c, 30d.

On the other hand, since in the first plane area 1A and in the second plane area 2A, the data fanout wire 30, the second connecting part 13 and the second connecting part 23 can be formed on different layers from one another, the area where the data fanout wire 30 may be located is greater than in the first bending area 1BA.

Therefore, as illustrated in FIG. 8, by adjusting the width W2 of the data fanout wire 30 in the first plane area 1A and in the second plane area 2A to be greater than the width W1 of the data fanout wire 30 in the first bending area 1BA, it is possible to adjust the resistance of the data fanout wire 30.

In other words, it is possible to maintain the width of the data fanout wire 30 in the first bending area 1BA where the area is limited, but increase the width of the data fanout wire 30 in the first plane area 1A and in the second plane area 2A where the area has some allowance.

In addition, the widths of each data fanout wire 30 located in the first bending area 1BA may be almost the same, but the present inventive concept is not limited thereto. Thus, the farther away the data fanout wire 30 is from the first connecting part 13, the greater the width of the data fanout wire 30.

Further, not all of the data fanout wires 30 may have a greater width in the first plane area and the second plane area, and thus, depending on the resistance to be adjusted, the widths of some of the data fanout wires 30 may increase, and the width increase may also vary.

In addition, in the present embodiment, for convenience of explanation, the first power supply line 10 and the first connecting part 13, and the second power supply line 20 and the second connecting part 23 were explained separately, but the first connecting part 13 and the second connecting part 23 may each be a part of the first power supply line 10 and the second power supply line 20, respectively.

Figure 9:
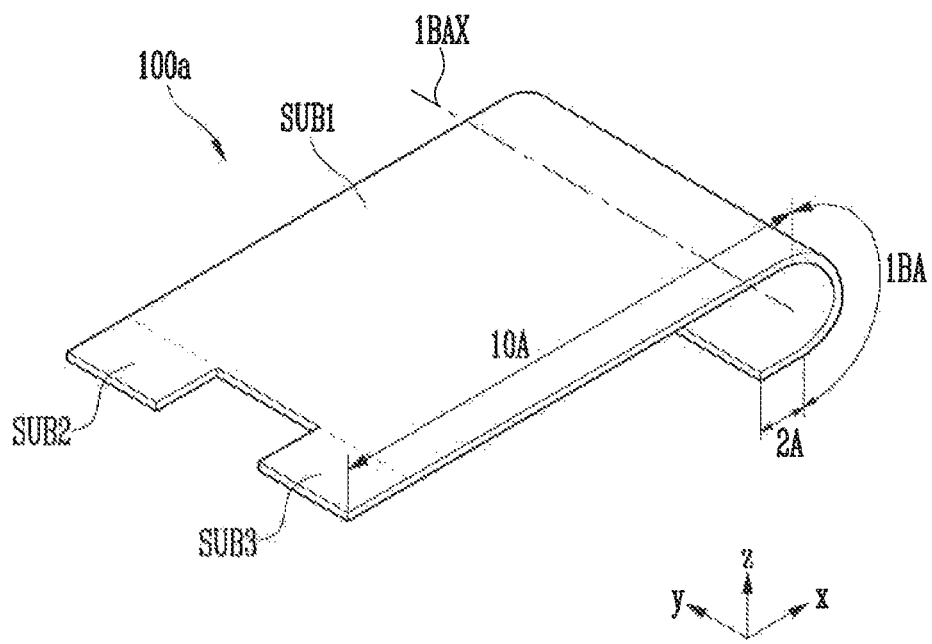
FIG. 9 is a perspective view schematically illustrating a substrate of a display device according to an embodiment of the present inventive concept.

FIG. 9 is a perspective view schematically illustrating the substrate 100a of the display device according to an exemplary embodiment of the present inventive concept.

Unlike the illustration in FIG. 1, the substrate 100a according to the present embodiment may be configured to include three areas, in other words, first to third areas SUB1, SUB2, SUB3.

As illustrated in FIG. 9, the first to third areas SUB1, SUB2, SUB3 each have a generally rectangular shape.

Each of the first to third areas SUB1, SUB2, SUB3 has a pixel area DA and a peripheral area NDA as those described above. The peripheral area corresponds to a bezel in a display device, and the width of the bezel may be determined according to the width of the peripheral area.

A description of the first to third areas SUB1, SUB2, SUB3 is provided hereinafter.

The first area SUB1 has the largest surface area among the first to third areas SUB1, SUB2, SUB3.

The first pixel area provided in the first area SUB1 may have a shape corresponding to the shape of the first area SUB1.

The first peripheral area provided in the first area SUB1 is provided on at least one side of the first pixel area. In the present embodiment, the first peripheral area may surround the rim of the first pixel area, but may be provided in areas except where the second area SUB2 and the third area SUB3 to be explained hereinafter are arranged.

The second area SUB2 may be located at one end of the first area SUB1, and may have a smaller area than the area of the first area SUB1.

The second area SUB2 has a second pixel area for displaying images and a second peripheral area surrounding at least a portion of the second pixel area.

The second pixel area has a shape corresponding to the second area SUB2. The second pixel area may be provided in a protruding form from the first pixel area, and may be connected directly with the first pixel area. In other words, in the second pixel area, the edge portion that is the closest to the first pixel area corresponds to the edge of the first pixel area (see e.g., the dashed lines therebetween).

The second peripheral area is provided on at least one side of the second pixel area. In the present embodiment, the second peripheral area surrounds the second pixel area, but not where the first pixel area and the second pixel area are connected to each other.

The third area SUB3 has a smaller surface area than the first area SUB1. The third area SUB3 may have an almost the same surface area as or a different surface area from the second area SUB2.

The third area SUB3 has a third pixel area for displaying images and a third peripheral area surrounding at least a portion of the third pixel area.

The third pixel area has a shape corresponding to the shape of the third area SUB3.

The third pixel area is provided in a form protruding from the first pixel area, and is directly connected to the first pixel area. In other words, in the third pixel area, the edge portion that is closest to the third pixel area corresponds to the edge of the first pixel area (see e.g., the dashed lines therebetween).

The third peripheral area is provided on at least one side of the third pixel area. In the present embodiment, the third peripheral area may surround the third pixel area, but not a portion where the first pixel area and the third pixel area are connected to each other.

In the present embodiment, the third area SUB3 may have a shape that is axisymmetric to the second area SUB2, in which case the arrangement relationship between each elements provided in the third area SUB3 may be substantially the same as the second area SUB2 except for some wires.

The shape and configuration of the first bending area 1BA and the second plane area 2A of the substrate 100a according to the present embodiment are the same as those of the aforementioned first bending area 1BA and the second plane area 2A, and thus explanations thereof will be omitted.

Figure 10:
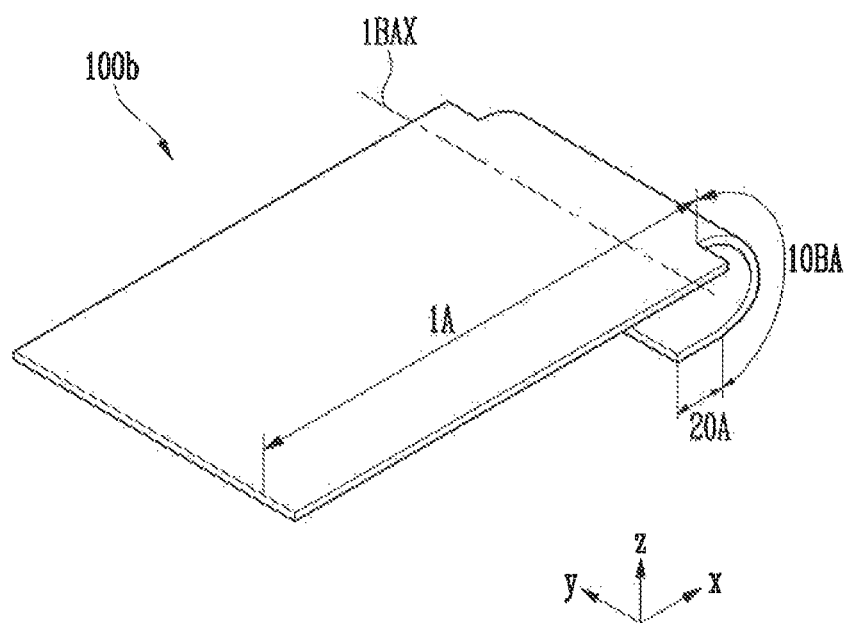
FIG. 10 is a perspective view schematically illustrating a substrate of a display device according to an exemplary embodiment of the present inventive concept.

FIG. 10 is a perspective view schematically illustrating a substrate of a display device according to an exemplary embodiment of the present inventive concept.

As illustrated in FIG. 10, the substrate 100b according to the present embodiment may include the first plane area 1A, the first bending area 10BA and the second plane area 20A.

The first plane area 1A illustrated in FIG. 10 has the same shape and configuration as the aforementioned first plane area 1A, and thus an explanation thereof will be omitted.

According to the present embodiment, a width of the first bending area 10BA in the first direction (y axis direction) may be smaller than a width of the first plane area 1A.

Further, a width of the second plane area 20A in the first direction (y axis direction) may be almost the same as the width of the first bending area 10BA, and smaller than the width of the first plane area 1A.

In other words, the substrate 100b may have a shape where a portion of one side surface of the first plane area 1A protrudes and extends.

In addition, illustrations in FIG. 10 are based on an assumption that the first plane area 1A has a rectangular shape, however, the display device may have the first plane area 10A in the shape as illustrated in FIG. 9.

According to an exemplary embodiment of the present inventive concept there is provided a display device with a minimized length of the power supply line. In addition, there is provided a display device with a reduced resistance deviation between data fanout wires.

While the present inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A display device, comprising:
a substrate comprising a first area, a second area and a bent area disposed between the first and second areas;
pixels located in the first area;
power supply lines configured to provide an operating power to the pixels; and
a plurality of data wires configured to provide data signals to the pixels, wherein the plurality of data wires comprise a plurality of groups, and
wherein the plurality of groups are spaced apart from each other in the bent area, and
wherein, in the second area, a portion of the plurality of data wires overlaps with a portion of the power supply lines in a plan view.

2. The display device according to claim 1, wherein in the first area, another portion of the plurality of data wires overlaps with another portion of the power supply lines in a plan view.

3. The display device according to claim 2, wherein the first area includes a pixel area in which the pixels are located and a peripheral area surrounding at least a portion of the pixel area.

4. The display device according to claim 3, wherein the another portion of the plurality of data wires overlapping with the another portion of the power supply lines are in the peripheral area.

5. The display device according to claim 1, wherein the plurality of data wires comprise at least four or more groups.

6. The display device according to claim 1, wherein each of the power supply lines is disposed between each two adjacent groups of the plurality of groups in the bent area.

7. The display device according to claim 1, wherein the power supply lines comprise a first power supply line configured to provide a first operating power to the pixels and a second power supply line configured to provide a second operating power smaller than the first operating power to the pixels.

8. The display device according to claim 1, further comprising:
a driver IC located in the second area and configured to provide the data signals to the plurality of data wires,
wherein, in the second area, the power supply lines extend as straight lines between the driver IC and the bent area.

9. A display device, comprising:
a substrate comprising a first area, a second area and a bent area disposed between the first and second areas;
pixels located in the first area;
power supply lines configured to provide an operating power to the pixels; and
a plurality of data wires configured to provide data signals to the pixels,
wherein the plurality of data wires comprise a plurality of groups, and
wherein the plurality of groups are spaced apart from each other in the bent area,
wherein the power supply lines comprise a first power supply line configured to provide a first operating power to the pixels and a second power supply line configured to provide a second operating power smaller than the first operating power to the pixels,
wherein one of the plurality of groups is disposed between the first power supply line and the second power supply line in the bent area, and
the power supply lines and the plurality of data wires are disposed in a same layer in the bent area.

10. The display device according to claim 9, wherein the plurality of data wires comprise a first group, a second group, a third group and a fourth group,
wherein the first power supply line is disposed between the second group and the third group in the bent area, and
wherein the second power supply line is disposed between the first group and the second group, and between the third group and the fourth group in the bent area.

11. A display device, comprising:
a substrate comprising a first area, a second area and a bent area disposed between the first and second areas;
pixels located in the first area;
power supply lines configured to provide an operating power to the pixels; and
a plurality of data wires configured to provide data signals to the pixels,
wherein the plurality of data wires comprise a plurality of groups, and
wherein the plurality of groups are spaced apart from each other in the bent area, and
wherein, in the first area, a portion of the plurality of data wires overlaps with a portion of the power supply lines in a plan view.

12. The display device according to claim 11, wherein in the second area, another portion of the plurality of data wires overlaps with another portion of the power supply lines in a plan view.

13. The display device according to claim 11, wherein the first area includes a pixel area in which the pixels are located and a peripheral area surrounding at least a portion of the pixel area.

14. The display device according to claim 13, wherein the portion of the plurality of data wires overlapping with the portion of the power supply lines are in the peripheral area.

15. The display device according to claim 11, wherein the plurality of data wires comprise at least four or more groups.

16. The display device according to claim 11, wherein each of the power supply lines is disposed between each two adjacent groups of the plurality of groups in the bent area.

17. The display device according to claim 11, wherein the power supply lines comprise a first power supply line configured to provide a first operating power to the pixels and a second power supply line configured to provide a second operating power smaller than the first operating power to the pixels.

* * * * *